United States Patent [19]

Nicholas, Jr.

[11] Patent Number: 4,570,156

[45] Date of Patent: Feb. 11, 1986

[54] SELF-CONTAINED SECURED WORK STATION

[75] Inventor: John J. Nicholas, Jr., Leesburg, Va.

[73] Assignee: Systematics General Corp., Sterling, Va.

[21] Appl. No.: 590,453

[22] Filed: Mar. 16, 1984

[51] Int. Cl.$^4$ .................. G08B 13/08; A47B 81/00
[52] U.S. Cl. .................. 340/547; 174/35 R; 248/551; 312/203; 340/693
[58] Field of Search .............. 312/203, 223, 237, 7.1; 248/551, 553; 174/35 R; 455/301, 300; 340/693, 547

[56] References Cited

U.S. PATENT DOCUMENTS

| | | | |
|---|---|---|---|
| 2,893,533 | 7/1959 | Childs | 181/201 |
| 3,426,166 | 2/1969 | Canceill | 340/547 |
| 4,066,305 | 1/1978 | Gazarek | 312/195 |
| 4,094,256 | 6/1978 | Holper et al. | 312/223 |
| 4,128,285 | 12/1978 | Lore et al. | 312/196 |
| 4,167,298 | 9/1979 | Plattner | 312/284 |
| 4,313,149 | 1/1982 | Hirose et al. | 312/223 |

Primary Examiner—Glen R. Swann, III
Attorney, Agent, or Firm—Berman, Aisenberg & Platt

[57] ABSTRACT

A work station is designed for use with electronic equipment whereby the placement of the equipment in the work station prevents undesired electromagnetic coupling between various pieces of the electronic equipment. A substantially horizontal work surface is provided between a cabinet at one end and a safe at the other end. The cabinet provides a Faraday cage for receiving a MODEM and for preventing the passage of electromagnetic radiation, whereby undesired coupling between the MODEM and other pieces of electronic equipment is substantially precluded. The safe is designed to house an encryption device. A horizontal work surface supports electronic input equipment, such as a word processor, in position for convenient use by an operator. The electronic equipment on the work surface is connected to the encryption device in the safe which is, in turn, connected to a modulator-demodulator (MODEM) in the cabinet. All of the electrical connections between these pieces of equipment are shielded to prevent undesired coupling. The work station is self-contained and is designed to comply with standards relating to secured work areas. The work station itself complies with the standards so that an appropriate environment may be easily secured by simply employing the self-contained work station in accordance with the invention.

14 Claims, 3 Drawing Figures

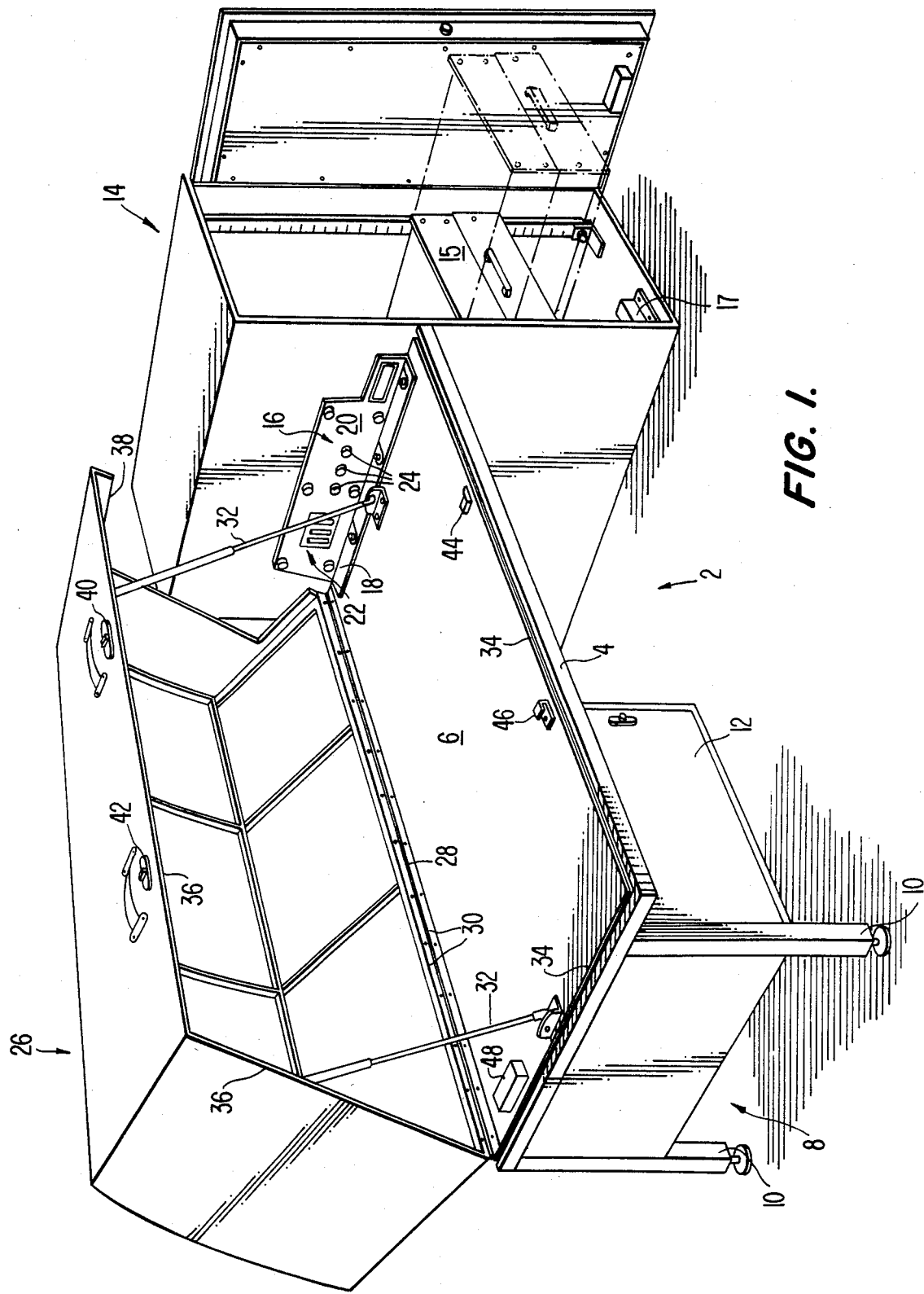
FIG. I.

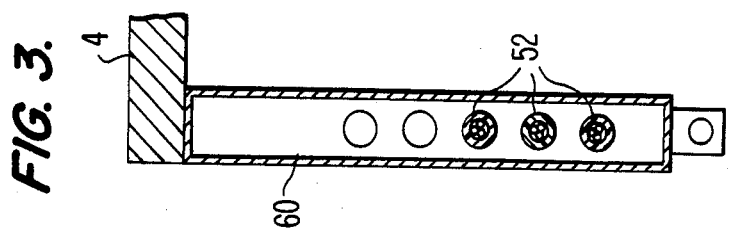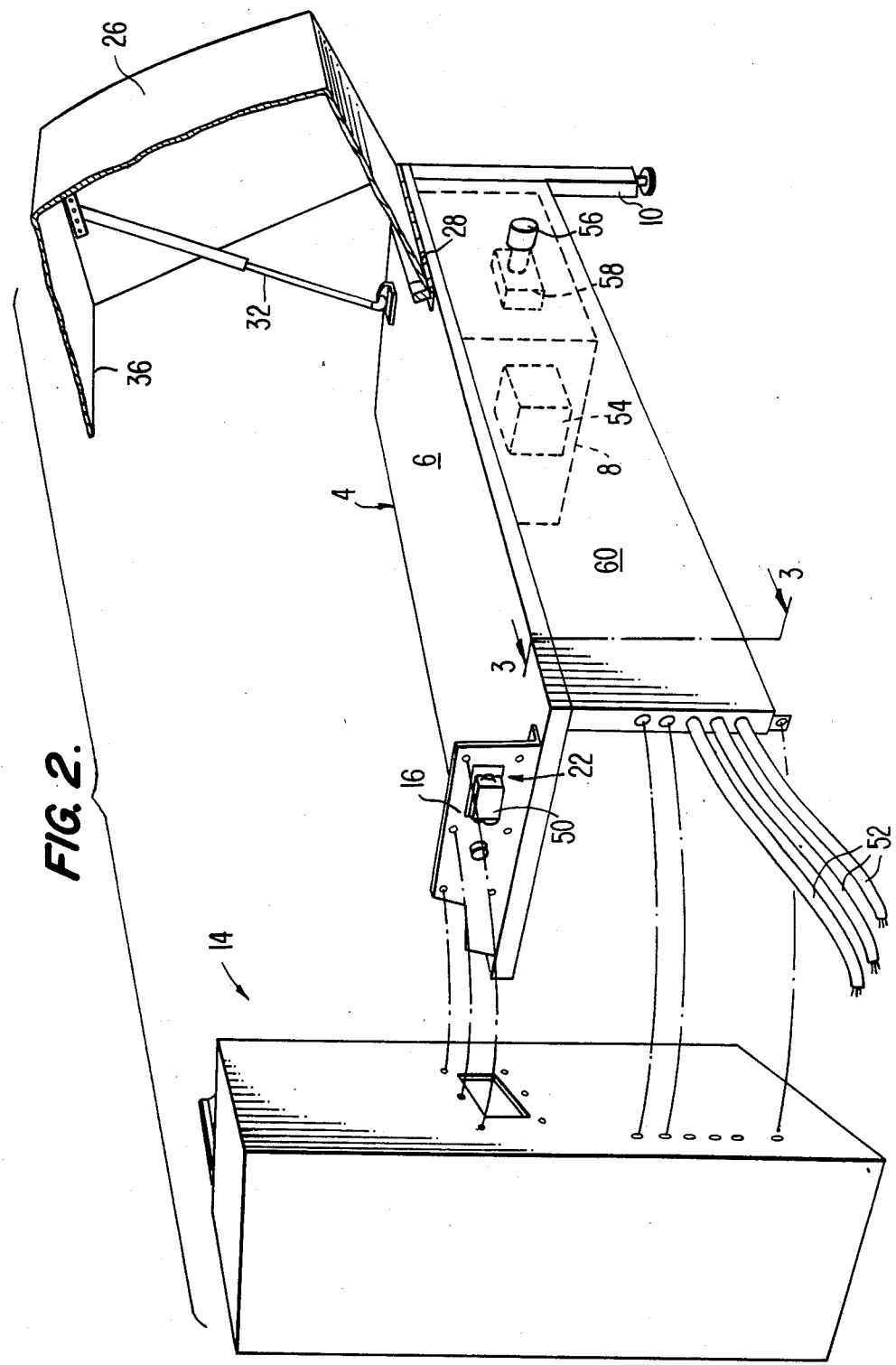

SELF-CONTAINED SECURED WORK STATION

TECHNICAL FIELD

This invention relates to the art of physically and electronically secured electronic equipment. In particular, the invention concerns apparatus used to provide a secured environment for electronic equipment.

BACKGROUND ART

The art of secured environments developed as a result of two basic requirements. First is the requirement of physical security, and second is the requirement of electronic security. Physical security for work areas is, of course, an old art and includes a wide variety of apparatus, from the known locked dor to sophisticated alarm systems. Electronic security deals with the prevention of surrepetitious detection by electronic means of confidential information.

It is known to provide apparatus for an individual to perform such functions as letter writing or speaking on the telephone from a single location. For example, a desk in an office is such an apparatus. The known rolltop desk includes a top for physical security which is placed in one position to allow the use of a horizontal surface of the desk. After use, the top is placed over the horizontal surface and locked to prevent unauthorized access to materials on the desk.

While only physical security was adequate for many years to prevent surreptitious detection of information, development of electronic devices has required other techniques for preventing unauthorized access to materials contained on a desk or transmitted electronically from the desk. For example, if an electronic device, such as a word processor, is operated, it may be possible to detect information contained in the word processor in various ways. First, it is possible to breach physical security and simply remove the memory elements of the word processor. Second, the word processor emanates electromagnetic waves, and it may be possible to detect those waves by the use of sophisticated electronic equipment.

It is known to electronically shield a device such as a word processor to limit the emanation of electromagnetic waves and to reduce the detectable characteristics of these waves to an acceptable level. This acceptable level is determined by the state of the art in electronic eavesdropping devices and other factors. In the United States, a common standard for providing electronic security for a single piece of electronic equipment is the "Tempest" standard.

While the shielding of electronic apparatus substantially reduces the possibility of surreptitious detection of emanated electromagnetic waves, it cannot entirely prevent it. Thus, it is not possible to place even a shielded piece of equipment in an arbitrary location in a room. The room must first be analyzed in what is known as a "site survey" to determine an acceptable location for the electronic apparatus. This site survey is unique for each room and requires a highly-trained person to inspect and analyze each proposed location.

Another complicating factor in the art of secured environments is the desire to transmit electronic signals to a remote location. These signals may contain data which is desired to be maintained in secrecy. The utility of direct detection of the electronic signal is typically eliminated by encoding the data with an encryption device. The encryption device codes the outgoing data in a manner which is known only to an authorized recipient. In a typical combination, a word processor is electronically connected to an encryption device which then transmits coded signals over a telephone line to the recipient.

Transmission of the information over the telephone line is accomplished with a modulator-demodulator (MODEM). The output from the encryption device is connected to the MODEM, and the MODEM in turn transmits the coded signals over the telephone lines.

This transmission of signals, however, is not entirely free from detection since it is possible for uncoded information to be superimposed on the encoded signal because of an electronic coupling between the word processor and the output line from the encryption device. If this occurs, the MODEM simply transmits both the coded and uncoded information over the telephone lines. An unauthorized person can then directly detect the combined signals and separate the uncoded data from the coded data by appropriate filtering.

The possibility of coupling between a word processor and a MODEM is reduced by using shielded conductors to connect these pieces of equipment. Also, the MODEM may electronically couple directly to the word processor, and this is usually prevented by placing the MODEM a substantial distance from the word processor and from the encryption device.

The major difficulty with the prior art procedure is that it takes a substantial amount of time to conduct the site survey and to make necessary modifications in the room. For example, one must determine all of the dimensions of the room, the make-up of the walls of the room and the identity of the neighbors. If it is necessary to modify the room by moving a wall in order to obtain adequate distance between pieces of equipment or by adding shielded conduit, additional expense is incurred. Further, it is usually specified that a particular organization, such as the U.S. Army Corps of Engineers, be employed to make the necessary physical changes, thus resulting in time lost in scheduling, etc.

This prior procedure is extremely time consuming and results in the inability to quickly set up a new installation.

The patent literature shows various techniques for dealing with physical security. The art does not, however, provide a workable combination of electronic security and physical security.

U.S. Pat. No. 4,167,298 (Plattner) simply shows a cabinet having a door which is pivoted to permit access to the cabinet; U.S. Pat. No. 4,128,285 (Lore, et al.) shows a work table wherein a theft-proof cover includes several sections connected to each other by hinges, and the cover may then be folded when the work station is in use; U.S. Pat. No. 4,066,305 (Gazarek) shows a desk for use with electronic equipment wherein a structural part of the desk allows electrical power and data cords to be passed through them; 2,893,533 (Childs) deals with physical security and describes a cabinet having a portion with a typewriter, which, when not in use, is covered by a panel to produce a horizontal surface that may be used as a desk; U.S. Pat. No. 4,313,149 (Hirose, et al.) shows cabinets for containing electronic equipment which are arranged in an overlapping manner to permit interconnecting electronic cables to pass through the overlapped portions; U.S. Pat. No. 4,094,256 (Holper, et al.) shows a work table having supports with channels therein for receiving electrical wires.

None of these patents even remotely suggests a solution to the problem of the excessive cost and time required to physically and electronically secure a room which contains electronic equipment dealing with data desired to be maintained secret.

SUMMARY OF THE INVENTION

In accordance with the invention, a self-contained electronically and physically secure work station is provided. It is adapted to receive electronic equipment, such as a word processor, typewriter, printer, or the like, an encryption device and a MODEM. These pieces of equipment are received in selected locations of the work station which have been designed to provide compliance with applicable government standards for such apparatus dealing with secret information.

A horizontal support surface receives electronic equipment, such as the word processor. In the preferred embodiment, this horizontal surface is in combination with a hinged cover to provide physical security. The hinged cover is easily operated and may be pivoted to a position wherein access to the electronic equipment is permitted. The electronic equipment is preferably that which is shielded in accordance with the Tempest standard.

At one end of the horizontal work surface is a safe for receiving an encryption device. This safe is a known device and meets the standards of a "Class 5 GSA" safe. In the preferred embodiment, the safe acts as a support for one end of the work station. It should be noted, however, that it is possible to provide the horizontal work surface with a support structure when a safe is not required.

The electronic equipment is electrically coupled to an encryption device located in the safe by terminals accessible from the exterior of the safe. The encryption device is in turn connected to an output line which leads from the safe to a MODEM. The lines which extend from the exterior of the safe to the MODEM are electrically shielded to reduce the detectable characteristics of electromagnetic waves associated with the signal carried by the shielded lines and to reduce the possibility of coupling with uncoded data.

At an end of the horizontal work surface opposite the safe is a cabinet for receiving the MODEM. This cabinet provides a Faraday cage for the MODEM and is preferably a metal cabinet having a hinged door with metallic contact throughout the perimeter of the opening to ensure complete shielding.

This cabinet substantially reduces the detectable characteristics of electromagnetic waves which pass through the cabinet. Thus, waves emanating from the electronic equipment cannot couple into the MODEM because of the Faraday cage. By placing the MODEM in a Faraday cage at one end of the work surface and the encryption device at the opposite end of the horizontal surface and in a metallic safe, the possibility of coupling between the data input to the encryption device and the MODEM is substantially reduced, and is of no practical moment.

The unique combination of physical security and electronic security allows the work station in accordance with the invention to be a marked improvement over the prior art. It is not necessary to conduct an expensive site survey and make extensive modifications to a new location when the work station of the invention is employed. In fact, the work station itself may be approved by government authorities to comply with standards such as NACSEM 5203. By providing a self-contained station which complies with such a standard, it is not necessary to make modifications to a room in order for the room to comply with that standard. It is only necessary to install the work station of the invention in the room and to begin operating the equipment.

It is an object of this invention to provide a self-contained work station which is physically and electronically secure.

It is a further object of this invention to provide a work station which complies with a security standard relating to the detectable characteristics of electromagnetic radiation emanating from electronic equipment used with the work station.

It is still another object of this invention to provide a method for physically securing a location by providing a physically secure, yet portable, work station.

It is yet another object of this invention to provide a work station wherein physical security is provided by a cover and an alarm system, and wherein electronic security is provided by shielding and placement of the electronic components.

BRIEF DESCRIPTION OF THE DRAWINGS

FIG. 1 is a perspective of a secured work station in accordance with the invention.

FIG. 2 is a partially exploded view of the work station, showing the side opposite from FIG. 1.

FIG. 3 is a cross-section taken along line 3—3 of FIG. 2.

DETAILED DESCRIPTION OF THE DRAWINGS

FIG. 1 shows a perspective view of a secured work station 2. A generally flat table 4 provides a working surface 6. Electronic equipment, such as a word processor, a printer, or the like may be placed on the working surface 6. A cabinet 8 is located at one end of the table 4 and may include legs 10 for support. The cabinet 8 has a front door 12 to allow access to the interior of the cabinet. An alarm switch is attached to the door to indicate when the door is open.

The opposite end of the table 4 is supported by a safe 14. In the preferred embodiment, a mounting plate 16 has a lip 18 bolted to the table 4 and a side 20 bolted to a vertical surface of the safe 14. The mounting plate 16 includes a connection panel 22 which receives connectors from the equipment placed on the working surface 6. The opposite side of the connector panel carries electrical conductors to the interior of the safe for connection to an encoder. The operation of the encoder may be controlled by switches 24 located on the mounting plate 16.

Physical security is provided for the equipment located on the working surface 6 by a cover 26. A rear edge of the cover is pivotally attached to the work table 4 by a hinge 28 which is preferably attached by screws 30 in such a manner that the heads of the screws will be protected when the cover 26 is in a closed position. Cover 26 is shown in FIG. 1 in an open position. Arms 32 maintain the cover 26 in the position shown in FIG. 1 and also provide means to assist rotation of the cover 26 between open and closed positions. Cover 26 is designed to have a center of gravity located to the rear of the hinge 30 when the cover 26 is in the position shown in FIG. 1. This means that the arms 32 will be in tension when the cover 26 is in the open position.

A groove 34 extends along two edges of the table 4 in the surface 6 and receives the lower edge 36 of the cover 26. This provides additional physical security by making it extremely difficult to slide an object between the edge 36 and the surface 6 when the cover 26 is in a closed position. One end of the cover 26 has a cut-out portion 38 which matches the peripheral shape of the mounting plate 16 to provide physical security when the cover 26 is in the closed position.

Cover 26 includes latches 40, 42 which cooperate with hooks 44, 46 to allow the cover 26 to be locked when in a closed position. A magnetic switch 48 detects when the cover 26 is in an open position and is, in turn, connected to an alarm system for indicating when the cover has been opened.

FIG. 2 shows the cover 26 partially broken away to illustrate its construction. In the preferred embodiment, the cover 26 is of fabricated high-impact plastic and comprises mainly smooth surfaces to minimize the opportunity for placement of hidden electronic bugs. The safe 14 is shown detached to show the rear portion of the connector panel 22, which includes a grounded box 50. This box is connected to shielding of conduits (not shown) connecting terminals on panel 22 with equipment located within the safe 14 to provide electronic security.

In the preferred embodiment, a coding or encryption apparatus is located within the safe 14. Drawers 15 may be used to support this apparatus. The electronic equipment located on the working surface 6 is connected to the encryption device through the connector panel 22. Conduits 52 extend from the interior of safe 14. These supply power to the encryption device and conduct data from the encryption device to the MODEM. Each of the conduits 52 comprises a shielded electrical transmission line to substantially reduce the possibility of coupling between electronic equipment and the transmission line. A magnetic switch 17 is connected to an alarm circuit to signal an open door of the safe.

Cabinet 8 preferably houses a MODEM 54. One of the conduits 52 will connect the encryption device in the safe 14 to the MODEM 54 for eventual transmission of data over telephone lines (not shown). The cabinet 8 is preferably made of sheet metal to provide a Faraday cage to substantially reduce the detectable characteristics of electromagnetic waves either emanating from the MODEM or impinging upon it. Door 12 and an opening in the cabinet covered by the door are preferably provided with electrical contacts to provide a completely enclosed cage. Connector 56 may be attached to telephone and power lines (not shown) to carry data signals to and from the MODEM and electrical power from a power line to provide electrical power for the work station. A filter box 58 contains known security filters for the connector 56. Thus, the only required interface with a non-secured environment is through the secured connector 56.

FIG. 3 shows a cross section taken along line 3—3 of FIG. 2. The rear wall comprises a hollow sheet metal panel 60. A plurality of conductors 52 passes through the hollow interior of the panel 60 to connect the various pieces of electronic equipment together.

It will be appreciated that a self-contained station has been described wherein physical and electronic security may be maintained. Physical security is maintained by a locked cabinet, a safe, and cover for the table. An alarm system provides an indication of a breach in any of these. The placement of a MODEM in a Faraday cage at one end of the work station, an encryption device at an opposite end, and electronic input equipment on a convenient horizontal surface virtually eliminates the possibility of coupling between these devices: Said encryption device and electronic input equipment being of such device as to meet radiated standards as the tempest standard. The electronic input equipment may be placed on the horizontal work surface 6 without fear of electromagnetic coupling with the MODEM since the MODEM is located within a Faraday cage spaced from the horizontal work surface. In the preferred embodiment, the safe 14 supports one end of the table 4. It should be appreciated, however, that it is possible to support the table 4 by other means and to provide a single safe for use with a plurality of work stations.

Modifications within the scope of the appended claims will be apparent to those of skill in the art.

What is claimed is:

1. Security apparatus comprising
   work table means providing a substantially horizontal surface for supporting first electronic equipment;
   a cabinet for receiving and shielding second electronic equipment, said cabinet having first shielding means for substantially preventing the passage of electromagnetic energy whereby coupling between said energy and said electronic equipment is precluded;
   signal transmission means for electrically connecting said first electronic equipment to said second electronic equipment;
   second shielding means on said signal transmission means for substantially preventing the passage of electromagnetic radiation; and
   wherein said work table means, said cabinet, and said signal transmission means are physically connected to form a single unit.

2. The apparatus of claim 1 further comprising physical security means comprising a cover for said substantially horizontal surface to enclose said first electronic equipment.

3. The apparatus of claim 2 further comprising safe means attached to said work table means, said safe means comprising means for receiving and protecting third electronic equipment.

4. The apparatus of claim 3 further comprising second signal transmission means for electrically connecting said first electronic equipment to said third electronic equipment.

5. The apparatus of claim 2 wherein said physical security means further comprises alarm means for detecting when said cover is in an operational position enclosing said first electronic equipment and for indicating when said cover means is not in said operational position.

6. The apparatus of claim 5 wherein said substantially horizontal surface has a groove therein for receiving a lower edge of said cover when said cover is in said operational position.

7. The apparatus of claim 6 further comprising hinge means for pivotally attaching an edge of said cover to said substantially horizontal surface and wherein said cover is pivotable to a non-operational position wherein the center of gravity of said cover is on the opposite side of said hinge from said substantially horizontal surface.

8. The apparatus of claim 7 further comprising arm means extending between said cover and said substantially horizontal surface for supporting said cover when in said non-operational position.

9. A method of physically and electronically securing a work area in an environment comprising placing the apparatus of claim 1 in said work area whereby said work area is secured without the necessity of securing said environment.

10. The method of claim 9 wherein said work area is subject to standards regarding physical and electronic security and said apparatus complies with said standards.

11. In a secured system using electronic equipment of the type subject to specified limits on detectable characteristics of electromagnetic waves emanating from said electronic equipment, the improvement comprising a self-contained work station complying with said specified limits and comprising table means providing a surface for supporting at least one piece of said electronic equipment, cabinet means for receiving another piece of said electronic equipment and for substantially preventing the passage of electromagnetic radiation whereby coupling between said electromagnetic radiation and said electronic equipment is precluded, and electronically secured conduit means comprising signal transmission means for carrying electrical signals from selected said electronic equipment and shielding means for substantially preventing the passage of electromagnetic radiation.

12. The apparatus of claim 9 further comprising cover means for at least partially enclosing said electronic equipment on said surface.

13. The apparatus of claim 10 further comprising safe means for receiving and protecting at least some of said electronic equipment and for supporting a portion of said work table means.

14. A self-contained physically and electronically secure work station which complies with a standard relating to secured work areas for a plurality of pieces of electronic equipment comprising a substantially horizontal surface for receiving one of said pieces of electronic equipment, a cabinet at a first end of and below said substantially horizontal surface for receiving another of said pieces of electronic equipment, said cabinet being of an electrically conductive material and having a door which provides electrical contact with an edge of an opening when said door covers said opening to substantially prevent the passage of electromagnetic radiation whereby undesired electrical coupling between said one piece of electronic equipment and said another piece of electronic equipment is precluded, a safe at a second end of said substantially horizontal surface for receiving and protecting a third piece of said electronic equipment, signal conduction means for interconnecting said pieces of electronic equipment, said signal conduction means being electronically shielded to substantially prevent the passage of electromagnetic radiation, cover means hingedly connected to said substantially horizontal surface for enclosing said one of said pieces of electronic equipment when in an operational position and for allowing an operator access to said one of said pieces of electronic equipment when in a non-operational position, and alarm means for detecting when said cover means is in said non-operational position and for providing an indication thereof, whereby a self-contained work station which is physically and electronically secure is provided.

* * * * *